United States Patent
Omstead et al.

(10) Patent No.: US 10,468,595 B2
(45) Date of Patent: *Nov. 5, 2019

(54) SEMICONDUCTOR DEVICE STRUCTURES INCLUDING SILICON-CONTAINING DIELECTRIC MATERIALS

(71) Applicant: Micron Technology, Inc., Boise, ID (US)

(72) Inventors: Thomas R. Omstead, Boise, ID (US); Cole S. Franklin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/164,510

(22) Filed: Oct. 18, 2018

(65) Prior Publication Data

US 2019/0051826 A1     Feb. 14, 2019

Related U.S. Application Data

(60) Continuation of application No. 15/130,550, filed on Apr. 15, 2016, now Pat. No. 10,121,966, which is a
(Continued)

(51) Int. Cl.
*H01L 45/00*     (2006.01)
*H01L 21/02*     (2006.01)
(Continued)

(52) U.S. Cl.
CPC .......... *H01L 45/124* (2013.01); *C23C 16/345* (2013.01); *C23C 16/36* (2013.01); *C23C 16/45534* (2013.01); *C23C 16/45542* (2013.01); *H01L 21/0217* (2013.01); *H01L 21/0228* (2013.01); *H01L 21/02126* (2013.01);
(Continued)

(58) Field of Classification Search
CPC ... H01L 45/124; H01L 45/126; H01L 45/141; H01L 45/065; H01L 27/2481; H01L 21/02167; H01L 21/02315; H01L 21/0228; H01L 21/02274; H01L 21/0217; H01L 21/02126; H01L 21/283; H01L 21/02164;
(Continued)

(56) References Cited

U.S. PATENT DOCUMENTS

| | | |
|---|---|---|
| 7,077,904 B2 | 7/2006 | Cho et al. |
| 7,651,955 B2 | 1/2010 | Ranish et al. |

(Continued)

FOREIGN PATENT DOCUMENTS

| | | |
|---|---|---|
| JP | 2006-286711 A | 10/2006 |
| JP | 2008-218684 A | 9/2008 |

(Continued)

*Primary Examiner* — John P. Dulka
(74) *Attorney, Agent, or Firm* — TraskBritt

(57) ABSTRACT

A method of forming a silicon-containing dielectric material. The method includes forming a plasma comprising nitrogen radicals, absorbing the nitrogen radicals onto a substrate, and exposing the substrate to a silicon-containing precursor in a non-plasma environment to form monolayers of a silicon-containing dielectric material on the substrate. Additional methods are also described, as are semiconductor device structures including the silicon-containing dielectric material and methods of forming the semiconductor device structures.

19 Claims, 2 Drawing Sheets

Related U.S. Application Data division of application No. 13/932,667, filed on Jul. 1, 2013, now Pat. No. 9,343,317.

(51) Int. Cl.
  H01L 21/283 (2006.01)
  C23C 16/34 (2006.01)
  C23C 16/36 (2006.01)
  C23C 16/455 (2006.01)
  H01L 27/24 (2006.01)
  H01L 21/768 (2006.01)

(52) U.S. Cl.
  CPC .. *H01L 21/02164* (2013.01); *H01L 21/02167* (2013.01); *H01L 21/02274* (2013.01); *H01L 21/02315* (2013.01); *H01L 21/283* (2013.01); *H01L 27/2481* (2013.01); *H01L 45/065* (2013.01); *H01L 45/126* (2013.01); *H01L 45/141* (2013.01); *H01L 21/76829* (2013.01); *H01L 45/06* (2013.01); *H01L 45/12* (2013.01); *H01L 45/1233* (2013.01); *H01L 45/16* (2013.01)

(58) Field of Classification Search
  CPC . C23C 16/45534; C23C 16/345; C23C 16/36; C23C 16/45542
  See application file for complete search history.

(56) References Cited

U.S. PATENT DOCUMENTS

| | | |
|---|---|---|
| 7,910,497 B2 | 3/2011 | Olsen et al. |
| 8,298,628 B2 | 10/2012 | Yang et al. |
| 10,121,966 B2 * | 11/2018 | Omstead ........... H01L 21/02126 |
| 2005/0260347 A1 | 11/2005 | Narwankar et al. |
| 2006/0178019 A1 | 8/2006 | Senzaki et al. |
| 2010/0244114 A1 | 9/2010 | Konno et al. |
| 2011/0057248 A1 | 3/2011 | Ma et al. |
| 2011/0129616 A1 | 6/2011 | Ingle et al. |
| 2012/0025323 A1 | 2/2012 | Teo et al. |
| 2012/0196155 A1 | 8/2012 | Bencher et al. |
| 2013/0161583 A1 | 6/2013 | Blomme et al. |
| 2015/0004805 A1 | 1/2015 | Omstead et al. |

FOREIGN PATENT DOCUMENTS

| | | |
|---|---|---|
| JP | 2011-524087 | 8/2011 |
| JP | 2012-216631 A | 11/2012 |
| WO | 2007/002040 A2 | 1/2007 |
| WO | 2012/047812 A2 | 4/2012 |

* cited by examiner

SEMICONDUCTOR DEVICE STRUCTURES INCLUDING SILICON-CONTAINING DIELECTRIC MATERIALS

CROSS-REFERENCE TO RELATED APPLICATIONS

This application is a continuation of U.S. patent application Ser. No. 15/130,550, filed Apr. 15, 2016, now U.S. Pat. No. 10,121,966, issued Nov. 6, 2018, which is a divisional of U.S. patent application Ser. No. 13/932,667 filed Jul. 1, 2013, now U.S. Pat. No. 9,343,317, issued May 17, 2016, the disclosure of each of which is hereby incorporated herein in its entirety by this reference.

TECHNICAL FIELD

Embodiments of the disclosure relate to the field of semiconductor device design and fabrication. More specifically, embodiments of the disclosure relate to methods of forming silicon-containing dielectric materials by atomic layer deposition (ALD)-type processes, and to related semiconductor device structures and methods of forming the semiconductor device structures.

BACKGROUND

Silicon nitride (SiN), silicon carbon nitride ($SiCN_y$), silicon oxide ($SiO_x$), and silicon carbon oxide ($SiCO_x$) are known in the semiconductor art as dielectric materials. These dielectric materials are formed by various techniques including chemical vapor deposition (CVD) or atomic layer deposition (ALD). As semiconductor devices get smaller with high aspect ratio features, often including sensitive materials, conventional CVD and ALD processes are no longer suitable for forming these dielectric materials. In addition, ALD processes are slow and do not form a desired thickness of the dielectric material at a sufficient rate. Also, when these dielectric materials are formed by an ALD process that uses ammonia or an amine as a precursor, by-products include hydrogen and partially fragmented ammonia or amines, which degrade exposed components of a semiconductor device structure on which the dielectric material is formed. In addition, conventional ALD processes are conducted at a temperature that may damage already-formed components on the semiconductor device structure.

It would be desirable to have improved methods of forming silicon-containing dielectric materials by ALD, such that good quality, conformality, and electrical properties are achieved.

DETAILED DESCRIPTION

Figure 1:
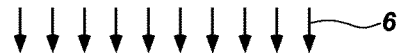
FIGS. 1-5 are partial cross-sectional views illustrating different process stages of a method of forming a silicon-containing dielectric material in accordance with an embodiment of the present disclosure.

Methods of forming a silicon-containing dielectric material are disclosed, as are related semiconductor device structures including these materials and methods of forming the semiconductor device structures. The silicon-containing dielectric material may include a silicon oxide material or a silicon nitride material, either of which material may also include carbon. The silicon-containing dielectric material may include a silicon oxide ($SiO_x$) material, a silicon nitride ($SiN_y$) material, a silicon carbon nitride ($SiC_xN_y$) material, or a silicon carbon oxide ($SiC_xO_y$) material, where x and y is each an integer greater than or equal to 1. The silicon-containing dielectric material may be a stoichiometric material or a non-stoichiometric material. The silicon-containing dielectric material may be formed on a substrate by an atomic layer deposition (ALD)-type process. By utilizing a plasma during a portion of the ALD process, the silicon-containing dielectric material may be formed at a low temperature, such as at a temperature less than about 320° C., such as less than about 300° C. or between about room temperature (from about 20° C. to about 25° C.) and about 200° C. In one embodiment, the plasma is free of ammonia or an amine, yet still achieves the formation of the silicon-containing dielectric material. The formation of the remaining portion of the silicon-containing dielectric material may be conducted in the absence of the plasma but in the same tool. Thus, a plasma enhanced ALD (PEALD) process of forming the silicon-containing dielectric material is disclosed.

One advantage of the PEALD process includes forming the silicon-containing dielectric material having excellent step coverage and conformity. The silicon-containing dielectric material may also be formed at a reasonable throughput and have low particle and defect levels. In addition, the use of conventional oxidizing agents may be avoided as a portion of the process is conducted using the plasma, enabling the use of a nitrogen radical source as a nitrogen source.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided herein does not form a complete process flow for forming a semiconductor device structure, and each of the semiconductor device structures described below do not form a complete semiconductor device. Only those process acts and structures necessary to understand the embodiments of the disclosure are described in detail below. Additional acts to form a complete semiconductor device may be performed by conventional fabrication techniques. Also note, any drawings accompanying the present application are for illustrative purposes only, and are thus not drawn to scale. Additionally, elements common between figures may retain the same numerical designation.

As used herein, the singular forms "a," "an," and "the" are intended to include the plural forms as well, unless the context clearly indicates otherwise.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "substantially," in reference to a given parameter, property, or condition, means to a degree that one of ordinary skill in the art would understand that the given parameter, property, or condition is met with a small degree of variance, such as within acceptable manufacturing tolerances.

As used herein, the term "substrate" means and includes a foundation material or construction upon which components, such as those within a semiconductor device structure are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As shown in FIG. 1, the method may include placing a substrate 2 on a heater 4 in a reactor (not shown). A chamber of the reactor may be purged using a purge gas 6 before producing the plasma. The purge may be conducted for an amount of time ranging from about 1 second to about 50 seconds. However, for temperature sensitive materials, the purge time may be reduced. During the purge, a pressure within the chamber may be decreased, such as to a pressure of less than about 1 Torr, such as about 0.2 Torr. Reactants (a nitrogen radical precursor, an oxygen-containing precursor (if present), a silicon-containing precursor, a carbon-containing precursor (if present), or a rate-enhancing gas, as described in more detail below) may be provided into the chamber in gaseous form to produce a plasma from a portion of the reactants. The chamber may be a conventional CVD reactor, such as a PECVD reactor. By way of example, an Applied Materials PRODUCER® reactor may be used. However, other reactors may also be used. The reactor may be configured to hold a single substrate or multiple substrates, depending on the desired throughput of the process.

Figure 2:
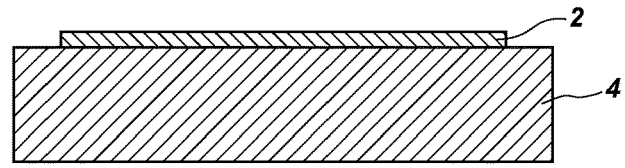

After purging the chamber, the substrate 2 may be exposed to energy 8 to produce a plasma 10 that includes excited nitrogen species, as shown in FIG. 2. A nitrogen radical precursor in gaseous form may be dissociated into the excited nitrogen species (e.g., nitrogen radicals (N.)) to produce the plasma 10. The nitrogen radical precursor may include, but is not limited to, elemental nitrogen, nitrous oxide ($N_2O$), ammonia, nitrogen oxide, azide, an azide derivative, dinitrogen pentoxide, hydrazine, a hydrazine derivative, or combinations thereof. Ammonia may be used as the nitrogen radical precursor if underlying materials are not damaged by hydrogen, which would be produced during the plasma portion of the process. In one embodiment, the nitrogen radical precursor is elemental nitrogen. While embodiments herein describe the nitrogen radical precursor as elemental nitrogen, the nitrogen radical precursor may be one of the other chemical compounds previously described. When sufficient energy 8 is applied to the elemental nitrogen, the elemental nitrogen may dissociate into the nitrogen radicals. The plasma process may be initiated as the substrate 2 is heated to its desired temperature rather than waiting for the temperature of the substrate 2 to stabilize, which may prevent damage to the substrate 2 caused by evaporation of the reactants. The substrate 2 may be exposed to the plasma 10 while the substrate 2 is coming to temperature, enabling monolayers of silicon, nitrogen, carbon (if present), and oxygen (if present) to be formed before the substrate 2 reaches a temperature at which existing materials on the substrate 2 degrade. Thus, any already-formed materials or exposed materials on the substrate 2 may be sealed with the forming silicon-containing dielectric material as the substrate 2 heats up, which prevents thermal out-gassing, diffusion, or evaporation of the already-formed materials. Thus, the already-formed materials may not evaporate or be damaged during the formation of the silicon-containing dielectric material.

The plasma 10 is produced by exposing the elemental nitrogen to sufficient energy to excite the elemental nitrogen and form the nitrogen radicals. The plasma 10 may be formed by subjecting the elemental nitrogen to a plasma power between about 40 Watts and about 2500 Watts, such as between about 100 Watts and about 1000 Watts. The plasma 10 may be a capacitive, inductive, or microwave plasma. The substrate 2 may be exposed to the plasma 10 for an amount of time ranging from about 1 second to about 200 seconds, such as from about 1 second to about 100 seconds, or from about 5 seconds to about 20 seconds. Other conditions for generating and maintaining the plasma 10 (e.g., temperature, pressure, flow rate) may be selected based on at least one of a desired concentration of nitrogen and oxygen (if present) in the silicon-containing dielectric material.

A rate-enhancing gas may, optionally, be present in the plasma 10. The rate-enhancing gas may be introduced with the nitrogen radical precursor. The nitrogen radical precursor and the rate-enhancing gas (if present) may be introduced into the chamber in gaseous form. The rate-enhancing gas may be substantially non-reactive and have a high thermal conductivity, sufficient to dissociate the nitrogen radical precursor into the nitrogen radicals upon exposure to the energy 8 provided to form the plasma 10. The rate-enhancing gas may be a noble gas including, but not limited to, helium, neon, argon, krypton, xenon, or radon. In one embodiment, the rate-enhancing gas is helium. When exposed to the energy 8, the helium may form metastable helium atoms (He*), which have sufficiently high thermal conductivity to dissociate the nitrogen radical precursor into nitrogen radicals. The energy of the excited helium atoms may be transferred to the nitrogen radical precursor, causing dissociation of the nitrogen radical precursor into the nitrogen radicals.

Figure 3:

In the presence of the plasma 10, the nitrogen radicals are reactive and may chemisorb to a surface of the substrate 2, as shown in FIG. 3. However, the nitrogen may not actually form (e.g., deposit) on the substrate 2 at this point in the process. The energy 8 may be turned off, terminating the plasma. The reactor may then be purged, such as with another purge gas 12 that includes, for example, the nitrogen radical precursor and the rate-enhancing gas (if present). In the absence of the plasma 10, the purge gas may be substantially non-reactive. During the purge, the nitrogen radicals remain absorbed to the substrate 2. The purge may be conducted for an amount of time ranging from about 0.1 second to about 50 seconds. Thus, the nitrogen radicals may function as a source of nitrogen in the silicon-containing dielectric material. By utilizing the helium or other rate-enhancing gas to form the nitrogen radicals, nitrogen may be incorporated into the silicon-containing dielectric material without generating hydrogen, which would damage other components of the semiconductor device.

Figure 4:
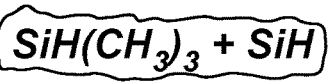
Figure 4:
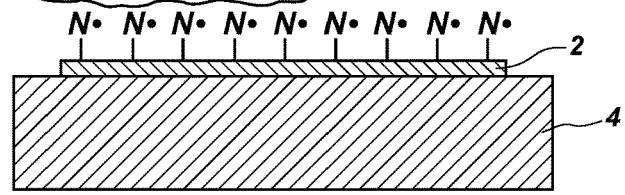

As shown in FIG. 4, a silicon-containing precursor or a silicon-containing precursor and a carbon-containing precursor, depending on the silicon-containing dielectric material to be formed, may be introduced into the reactor following the purge. A reactant gas 14 including the silicon-containing precursor and the carbon-containing precursor (if present) may be introduced into the chamber. The silicon-containing precursor may include, but is not limited to, silane ($SiH_4$), tetraethylorthosilicate (TEOS), trisilylamine (TSA), tetramethylcyclotetrasiloxane (TOMCAT), or combinations thereof. In one embodiment, the silicon-containing precursor is silane. However, other conventional silicon-containing precursors may be used. The carbon-containing precursor may include, but is not limited to, trimethyl silane (TMS), an alkyl amine, acetylene, propylene, or combinations thereof. In one embodiment, the carbon-containing precursor is TMS. However, other conventional carbon-containing precursors may be used. The silicon-containing precursor and the carbon-containing precursor (if present) may be selected depending on the silicon-containing dielectric material to be formed. The silicon-containing precursor and the carbon-containing precursor may be introduced separately or as a mixture depending on the desired content of silicon and carbon in the resulting silicon-containing dielectric material. In one embodiment, a mixture of TMS and silane is used to provide an increased deposition rate of the silicon and carbon monolayers. The substrate 2 having the nitrogen chemisorbed to its surface may be exposed to the silicon-containing precursor and the carbon-containing precursor (if present) so that silicon monolayers and carbon monolayers are formed and bonded to the nitrogen. The silicon-containing precursor and the carbon-containing precursor (if present) may be flowed for an amount of time ranging from about 1 second to about 50 seconds.

To reduce or prevent overheating of the substrate 2 during the plasma process, the pressure of the chamber may be increased during exposure of the substrate 2 to the silicon-containing precursor or the silicon-containing precursor and the carbon-containing precursor. The pressure in the chamber may be increased from its initial state (at about 2 Torr), such as by controlling a pressure control valve. The pressure may be increased to from about 6 Torr to about 12 Torr, such as about 8 Torr. In addition, a thermally conductive gas, such as helium, argon, or hydrogen, may be introduced into the chamber to control the temperature of the substrate 2. The thermally conductive gas may increase conduction away from the substrate 2, lowering the temperature of the substrate 2. The thermally conductive gas and the increased pressure in the chamber may also be used at other stages during the formation of the silicon-containing dielectric material to reduce or prevent overheating of the substrate 2.

The plasma 10 may be cycled on and off during formation of the silicon-containing dielectric material. The plasma 10 may be turned on while the substrate 2 is exposed to the nitrogen radical precursor and rate-enhancing gas (if present), following which the plasma 10 may be turned off before the substrate 2 is exposed to the silicon-containing precursor and the carbon-containing precursor (if present). Thus, only a portion of the process of the present disclosure is conducted in the presence of the plasma 10. Since the plasma contains the nitrogen radical precursor and the oxygen-containing precursor (if present) and is free of ammonia or an amine, no hydrogen-containing species are produced that may potentially damage already-formed materials on the substrate 2. While hydrogen may be present in the silicon-containing precursor and the carbon-containing precursor (if present), reactive hydrogen species are not produced because no plasma 10 is present at this stage of the process.

Figure 5:
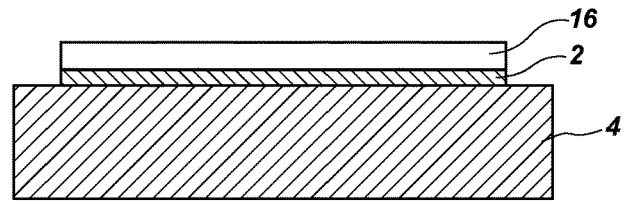

By conducting multiple cycles of exposure to the elemental nitrogen, oxygen-containing precursor (if present), silicon-containing precursor, and carbon-containing precursor (if present), the silicon-containing dielectric material 16 (i.e., silicon carbon nitride material) may be formed on the substrate 2, as shown in FIG. 5. The silicon-containing dielectric material 16 may be formed at a rate of from about 10 Å/min to about 500 Å/min and to a thickness within a range of from about 10 Å to about 1000 Å.

While the embodiments of the disclosure as described above and illustrated in FIGS. 1-5 produce $SiCN_y$ as the silicon-containing dielectric material 16 (using elemental nitrogen, helium, the silicon-containing precursor, and the carbon-containing precursor), the helium is optional and is used to increase a rate at which the silicon-containing dielectric material 16 is formed. However, the plasma portion of the process may be conducted without (i.e., in the absence of) helium or other rate-enhancing gas. In addition, if the silicon-containing dielectric material 16 is to include oxygen, the oxygen-containing precursor may be introduced with the elemental nitrogen and the rate-enhancing gas (if present), during the plasma portion of the process. If the silicon-containing dielectric material 16 is to include carbon, the carbon-containing precursor may be introduced with the silicon-containing precursor, i.e., during the non-plasma portion of the process.

While embodiments of the present disclosure describe the nitrogen radical precursor as being elemental nitrogen, nitrous oxide ($N_2O$) may be used instead of elemental nitrogen. When energy 8 to form such a plasma 10 is applied, the $N_2O$ may dissociate into the nitrogen radicals, as described above for the elemental nitrogen.

For formation of $SiN_y$ or $SiCN_y$, the nitrogen radicals are reactive and may chemisorb to a surface of the substrate 2 as shown in FIG. 2. If, however, the silicon-containing dielectric material 16 to be formed is $SiO_x$ or $SiC_xO_y$, the oxygen-containing precursor (not shown) may be present in the plasma 10. The oxygen-containing precursor may be oxygen ($O_2$), water ($H_2O$), nitrous oxide ($N_2O$), carbon dioxide ($CO_2$), or combinations thereof. The oxygen-containing precursor may be introduced in gaseous form into the chamber with the nitrogen radical precursor and rate-enhancing gas (if present). The oxygen-containing precursor may form an oxygen monolayer on the surface of the substrate 2 while the nitrogen radicals of the nitrogen radical precursor function to reduce spreading of the plasma. If the oxygen-containing precursor is present, the oxygen-containing precursor may be more reactive than the nitrogen radicals so that oxygen chemisorbs to the surface of the substrate 2.

Accordingly, the present disclosure includes a method of forming a silicon-containing dielectric material that comprises forming a plasma comprising nitrogen radicals, absorbing the nitrogen radicals onto a substrate, and exposing the substrate to a silicon-containing precursor in a non-plasma environment to form monolayers of a silicon-containing dielectric material on the substrate.

The present disclosure also includes a method of forming a silicon-containing dielectric material that comprises forming a plasma comprising nitrogen radicals and oxygen radicals, exposing a substrate to the plasma to absorb oxygen onto the substrate, and exposing the substrate to a silicon-containing precursor to form monolayers of a silicon-containing dielectric material on the substrate.

While embodiments of the present disclosure describe the rate-enhancing gas as helium, the rate-enhancing gas may be ammonia ($NH_3$) or hydrogen ($H_2$) if underlying materials are not damaged by hydrogen, which would be produced during the plasma portion of the process. Ammonia may also be used as the rate-enhancing gas when additional nitrogen content in the resulting silicon-containing dielectric material is desired.

The composition of the silicon-containing dielectric material 16 formed on the substrate 2 may vary depending on the ratio of elemental nitrogen, oxygen-containing precursor (if present), silicon-containing precursor, and the carbon-containing precursor (if present) used. For instance, the carbon and silicon content of the silicon-containing dielectric material 16 may depend on the ratio of silicon-containing precursor and carbon-containing precursor used during the process. If a higher silicon content is desired, a higher flow rate of the silicon-containing precursor may be used or a carbon-containing precursor containing both silicon and carbon (i.e., TMS) may be used. If a higher carbon content is desired, a higher flow rate of the carbon-containing precursor may be used.

The silicon-containing dielectric material 16 may include a stoichiometric or non-stoichiometric composition of the silicon oxide, the silicon carbon oxide, the silicon nitride, or the silicon carbon nitride. By way of example, the silicon oxide may be SiO or $SiO_2$, the silicon carbon oxide may include from about 30% to about 70% silicon, from about 4% to about 25% carbon, and from about 5% to about 66% oxygen, a silicon nitride may include from about 10% to about 90% silicon and from about 10% to about 90% nitrogen, and a silicon carbon nitride may include from about 30% to about 70% silicon, from about 4% to about 25% carbon, and from about 5% to about 66% nitrogen. In one embodiment, the silicon carbon nitride includes about 50% silicon, about 20% carbon, and about 30% nitrogen.

Examples of reactants for forming silicon oxide ($SiO_x$), silicon carbon oxide ($SiC_xO_y$) silicon nitride ($SiN_y$), and silicon carbon nitride ($SiC_xN_y$) are shown in Table 1. To form the respective silicon-containing dielectric materials 16, a portion of the process is conducted in a plasma environment and a portion of the process is conducted in a non-plasma environment, as previously described in reference to FIGS. 1-5.

TABLE 1

| Material to be formed | Reactants used in Plasma Environment | Reactants used in Non-plasma Environment |
|---|---|---|
| $SiO_x$ | $N_2O + N_2$ | $SiH_4$ |
| $SiC_xO_y$ | $CO_2 + N_2$ | $TMS + SiH_4$ |
| $SiN_y$ | $N_2$ | $SiH_4$ |
| $SiC_xN_y$ | $N_2$ | TMS |
|  |  | $TMS + SiH_4$ |
| $SiC_xN_y$ | TSA | TSA |

During the formation of $SiO_x$ or $SiC_xO_y$, the $N_2O$ or $CO_2$ in the plasma environment, respectively, function as the oxygen-containing precursor. The $N_2$ in the plasma reduces spreading of the plasma. Although nitrogen is present in the plasma along with oxygen, very little nitrogen is incorporated into the $SiO_x$ or $SiC_xO_y$ because the oxygen is significantly more reactive than the nitrogen. During the formation of the $SiN_y$ or $SiC_xN_y$, the $N_2$ functions as the nitrogen source and is incorporated into the silicon-containing dielectric material.

During the formation of $SiO_x$ or $SiN_y$, the $SiH_4$ in the non-plasma environment functions as the silicon source. During the formation of $SiC_xO_y$ or $SiC_xN_y$, the $SiH_4$ and TMS in the non-plasma environment function as the silicon source and the TMS functions as the carbon source.

Additional embodiments for forming silicon oxide ($SiO_x$), silicon carbon oxide ($SiCO_x$) silicon nitride ($SiN_y$), and silicon carbon nitride ($SiCN_y$) are shown in Table 2, which includes the presence of helium in the plasma environment.

TABLE 2

| Material to be formed | Plasma Environment | Non-plasma Environment |
|---|---|---|
| $SiO_2$ | $N_2O + N_2 + He$ (optional) | $SiH_4 + N_2$ |
| $SiC_xO_y$ | $CO_2 + N_2 + He$ (optional) | $TMS + SiH_4$ (optional) + $N_2$ |
| $SiN_y$ | $N_2 + He$ (optional) + $NH_3$ (optional) | $SiH_4 + He$ (optional) + $N_2$ |
| $SiC_xN_y$ | $N_2 + He$ (optional) + $NH_3$ (optional) | $TMS + N_2 + SiH_4$ (optional) + He (optional) |

Since the formation of the silicon-containing dielectric material 16 is conducted at a low temperature, damage done to existing components or materials on the substrate 2 may be reduced. Thus, the process of the present disclosure may be used to form the silicon-containing dielectric material in any application where materials susceptible to damage, such as volatilization or evaporation of the material, are already formed on the substrate 2. For instance, carbon materials and exotic materials may already be present on the substrate 2 before the silicon-containing dielectric material 16 is formed according to an embodiment of the present disclosure. The silicon-containing dielectric material 16 may also improve adhesion to other materials, such as underlying materials or overlying materials. In addition, the silicon-containing dielectric material 16 may function as a barrier to diffusion or evaporation of the underlying materials, and may also provide physical containment of the underlying materials. The silicon-containing dielectric material 16 may prevent or reduce diffusion of ions between neighboring materials, such as between a gate material and an electrode material. The silicon-containing dielectric material 16 may also prevent oxygen or water in the environment from diffusing through the silicon-containing dielectric material 16. The formation of the silicon-containing dielectric material may also reduce or prevent chamber contamination by sealing underlying materials as the substrate heats up.

Thus, in addition to being electrically insulative, the silicon-containing dielectric material 16 may function as a diffusion barrier, may provide improved adhesion between adjacent materials, may passivate underlying materials, or may encapsulate underlying materials.

The silicon-containing dielectric materials 16 formed as described above may exhibit improved electrical properties, such as low leakage and a high breakdown voltage, compared to materials formed by conventional CVD and ALD techniques at the same temperature range. Additionally, if the silicon-containing dielectric material 16 contains carbon, the silicon-containing dielectric material 16 may have a reduced dielectric constant (k). For silicon-containing dielectric materials 16 that include carbon, the wet etch rate may also be low, providing good selectivity to other materials.

Figure 6:
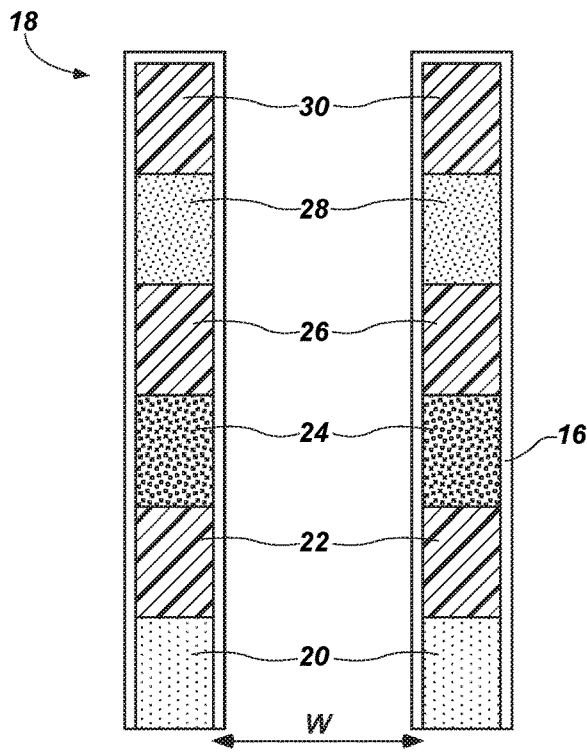
FIGS. 6 and 7 are partial cross-sectional views illustrating different process stages of a method of forming a semiconductor device structure including the silicon-containing dielectric material in accordance with an embodiment of the present disclosure.

The silicon-containing dielectric material 16 may be used in a semiconductor device structure. By way of example and as shown in FIG. 6, the silicon-containing dielectric material 16 may be formed on a stack 18. The stack 18 may include different components formed of various materials depending on its intended use, such as in memory applications. By way of example, the stack 18 may be used in non-volatile memory applications including, but not limited to, NAND flash memory or phase-change memory. By way of example, the stack 18 may include tungsten 20, a first electrode 22, a first chalcogenide material 24, a second electrode 26, a second chalcogenide material 28, and a third electrode 30. The first chalcogenide material 24 and the second chalcogenide material 28 may include chalcogenide materials having different compositions. The first, second, and third electrodes 22, 26, 30 may be formed from carbon. The stacks 18 may be formed by conventional techniques, which are not described in detail herein. The silicon-containing dielectric material 16 may be formed over stacks 18 separated by a distance W. The silicon-containing dielectric material 16 may be formed over the stacks 18 according to an embodiment of the present disclosure. In one embodiment, the silicon-containing dielectric material 16 is $SiC_xN_y$. Since the $SiC_xN_y$ includes carbon, the first silicon-containing dielectric material 16 may sufficiently adhere to the first, second, and third electrodes 22, 26, 30, which also include carbon. Additionally, since the formation of the $SiC_xN_y$ occurs at a low temperature, the silicon-containing dielectric material 16 may be formed without damaging the tungsten 20, the first, second, and third electrodes 22, 26, 30, and the first and second chalcogenide materials 24, 28. However, $SiO_x$, $SiN_y$, or $SiC_xO_y$ may also be formed as the silicon-containing dielectric material 16.

Figure 7:
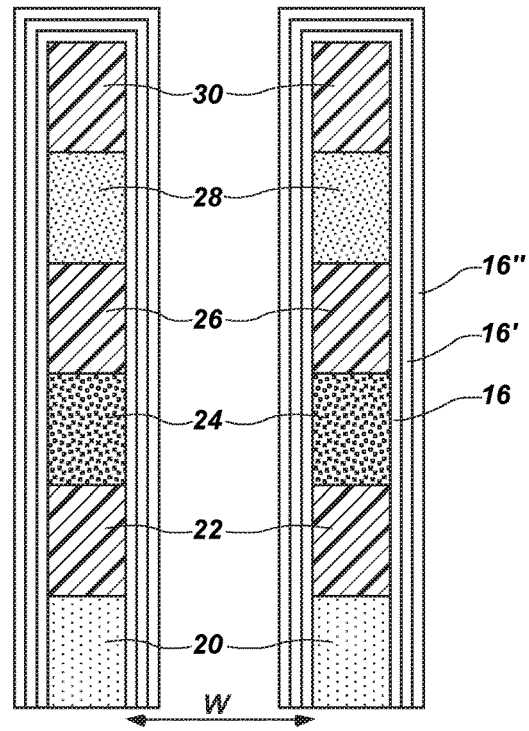

Multiple silicon-containing dielectric materials 16 may also be formed on the stacks 18, as shown in FIG. 7. A first silicon-containing dielectric material 16, such as $SiC_xN_y$, may be formed over the stack 18 according to an embodiment of the present disclosure. Since the $SiC_xN_y$ includes carbon, the first silicon-containing dielectric material 16 may adhere to the first, second, and third electrodes 22, 26, 30 which also include carbon. A second silicon-containing dielectric material 16', such as one of $SiO_x$, $SiN_y$, or $SiC_xO_y$, may be formed on the first silicon-containing dielectric material 16. In one embodiment, the second silicon-containing dielectric material 16' is $SiN_y$. The second silicon-containing dielectric material 16' may be formed according to an embodiment of the present disclosure. A third silicon-containing dielectric material 16", such as another of $SiO_x$, $SiN_y$, or $SiC_xO_y$, may be formed on the second silicon-containing dielectric material 16'. In one embodiment, the third silicon-containing dielectric material 16" is $SiC_xO_y$. The third silicon-containing dielectric material 16" may be formed according to an embodiment of the present disclosure. While $SiC_xN_y$ is described as being formed directly on the stack 18, the first, second, and third silicon-containing dielectric materials 16, 16', 16" may be formed from $SiC_xN_y$, $SiO_x$, $SiN_y$, or $SiC_xO_y$ in any order depending on the intended use of the stack 18.

Since the silicon-containing dielectric materials 16 are formed by a PEALD process, the methods of the present disclosure may be used to form the silicon-containing dielectric materials 16 on closely spaced adjacent stacks 18, such as stacks 18 separated by a distance W, such as between about 50 Å and about 220 Å or between about 180 Å and about 200 Å. Conventional processes, such as CVD processes, of forming the silicon-containing dielectric materials 16 are not capable of forming the materials on such closely spaced stacks 18. In addition, conventional ALD processes are not capable of forming the materials without damaging portions of the stacks 18, such as portions formed of chalcogenide materials or carbon materials.

Accordingly, the present disclosure includes a semiconductor device structure that comprises stacks and at least one conformal silicon-containing dielectric material on each of the stacks. The stacks are separated from one another by a distance of from about 50 Å to about 220 Å.

The present disclosure also includes a method of forming a semiconductor device structure that comprises forming stacks comprising tungsten, at least one electrode, and at least one chalcogenide material. At least one silicon-containing dielectric material is conformally formed on each of the stacks by forming a plasma comprising nitrogen radicals, absorbing nitrogen from the plasma onto a substrate, terminating the plasma, and exposing the substrate to a silicon-containing precursor in a non-plasma environment to form monolayers of the at least one silicon-containing dielectric material on the substrate.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A semiconductor device comprising:
   stacks separated from one another by a distance of from 180 Å to 200 Å; and
   at least one conformal silicon-containing dielectric material adjacent to each of the stacks.

2. The semiconductor device of claim 1, wherein the at least one conformal silicon-containing dielectric material comprises at least one of a silicon oxide material, a silicon nitride material, a silicon carbon nitride material, or a silicon carbon oxide material.

3. The semiconductor device of claim 1, wherein the at least one conformal silicon-containing dielectric material comprises at least one of a silicon oxide material or a silicon nitride material.

4. The semiconductor device of claim 3, wherein the at least one conformal silicon-containing dielectric material further comprises carbon.

5. The semiconductor device of claim 1, wherein the at least one conformal silicon-containing dielectric material comprises from 30% to 70% silicon, from 4% to 25% carbon, and from 5% to 66% oxygen.

6. The semiconductor device of claim 1, wherein the at least one conformal silicon-containing dielectric material comprises from 30% to 70% silicon, from 4% to 25% carbon, and from 5% to 66% nitrogen.

7. The semiconductor device of claim 1, wherein the stacks comprise at least one of a chalcogenide material or a carbon material.

8. The semiconductor device of claim 1, wherein the at least one conformal silicon-containing dielectric material comprises a thickness of from 10 Å to 1000 Å.

9. A semiconductor device comprising:
   stacks comprising a carbon material, the stacks separated from one another by a distance of from 50 Å to 220 Å; and
   at least one conformal silicon-containing dielectric material in contact with the stacks.

10. The semiconductor device of claim 9, wherein the at least one conformal silicon-containing dielectric material comprises silicon oxide or silicon dioxide.

11. The semiconductor device of claim 10, wherein the at least one conformal silicon-containing dielectric material further comprises carbon.

12. The semiconductor device of claim 9, wherein the stacks further comprise a chalcogenide material.

13. The semiconductor device of claim 9, wherein the at least one conformal silicon-containing dielectric material comprises a first conformal silicon-containing dielectric material in contact with the stacks and a second conformal silicon-containing dielectric material in contact with the first conformal silicon-containing dielectric material.

14. The semiconductor device of claim 13, further comprising a third conformal silicon-containing dielectric material in contact with the second conformal silicon-containing dielectric material.

15. The semiconductor device of claim 14, wherein:
the first conformal silicon-containing dielectric material comprises a silicon carbon nitride material;
the second conformal silicon-containing dielectric material comprises one of a silicon oxide material, a silicon nitride material, or a silicon carbon oxide material; and
the third conformal silicon-containing dielectric material comprises one of the silicon oxide material, the silicon nitride material, or the silicon carbon oxide material, the second conformal silicon-containing dielectric material and the third conformal silicon-containing dielectric material comprising different materials.

16. The semiconductor device of claim 14, wherein the first conformal silicon-containing dielectric material comprises a silicon carbon nitride material, the second conformal silicon-containing dielectric material comprises a silicon nitride material, and the third conformal silicon-containing dielectric material comprises a silicon carbon oxide material.

17. The semiconductor device of claim 9, wherein the at least one conformal silicon-containing dielectric material decreases the distance between the stacks.

18. A semiconductor device comprising:
stacks separated from one another by a distance of from 50 Å to 220 Å; and
at least one conformal silicon-containing dielectric material contacting the stacks, the at least one conformal silicon-containing dielectric material comprising from 30% to 70% silicon, from 4% to 25% carbon, and from 5% to 66% oxygen.

19. The semiconductor device of claim 18, wherein the at least one conformal silicon-containing dielectric material directly contacts the stacks.

* * * * *

UNITED STATES PATENT AND TRADEMARK OFFICE
CERTIFICATE OF CORRECTION

PATENT NO. : 10,468,595 B2  
APPLICATION NO. : 16/164510  
DATED : November 5, 2019  
INVENTOR(S) : Thomas R. Omstead and Cole S. Franklin Page 1 of 1

It is certified that error appears in the above-identified patent and that said Letters Patent is hereby corrected as shown below:

In the Specification

Column 3, Line 15, change "silicon-on-insulator ("SOT")" to --silicon-on-insulator ("SOI")--

Signed and Sealed this  
Twenty-fourth Day of December, 2019

Andrei Iancu  
*Director of the United States Patent and Trademark Office*